(12) United States Patent
Huang et al.

(10) Patent No.: US 11,791,834 B2
(45) Date of Patent: Oct. 17, 2023

(54) SEMICONDUCTOR CIRCUIT AND METHOD FOR PROVIDING CONFIGURABLE REFERENCE VOLTAGE WITH FULL-SCALE RANGE

(71) Applicant: TAIWAN SEMICONDUCTOR MANUFACTURING COMPANY LTD., Hsinchu (TW)

(72) Inventors: Yu-Jie Huang, Kaohsiung (TW); Mu-Shan Lin, Hsinchu (TW); Chien-Chun Tsai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/672,378

(22) Filed: Feb. 15, 2022

(65) Prior Publication Data
US 2023/0261668 A1    Aug. 17, 2023

(51) Int. Cl.
| | |
|---|---|
| *H03M 1/66* | (2006.01) |
| *H03M 1/74* | (2006.01) |
| *G05F 3/16* | (2006.01) |
| *G05F 3/26* | (2006.01) |
| *G05F 3/20* | (2006.01) |
| *G05F 1/59* | (2006.01) |

(52) U.S. Cl.
CPC ........... *H03M 1/747* (2013.01); *H03M 1/662* (2013.01); *G05F 1/59* (2013.01); *G05F 3/16* (2013.01); *G05F 3/205* (2013.01); *G05F 3/262* (2013.01)

(58) Field of Classification Search
CPC ......... H03M 1/747; H03M 1/662; G05F 3/16; G05F 3/262; G05F 3/205; G05F 1/59
See application file for complete search history.

(56) References Cited

U.S. PATENT DOCUMENTS 5,155,386 A * 10/1992 Abdi ................... H03K 3/02337
327/67

* cited by examiner

*Primary Examiner* — Joseph J Lauture
(74) *Attorney, Agent, or Firm* — WPAT Law; Anthony King

(57) ABSTRACT

A semiconductor circuit and a method of operating the same are provided. The semiconductor circuit comprises a first digital-to-analog converter configured to generate a first output current in response to a first binary code, and a second digital-to-analog converter configured to generate a second output current in response to a second binary code associated with the first binary code. The semiconductor circuit further comprises a first current-to-voltage converter configured to generate a first candidate voltage based on the first output current, and a second current-to-voltage converter configured to generate a second candidate voltage based on the second output current. The semiconductor circuit further comprises a multiplexer configured to output the target voltage based on the first candidate voltage or the second candidate voltage. The target voltage includes a configurable range associated with the second binary code.

20 Claims, 12 Drawing Sheets ized. Specifically,
SEMICONDUCTOR CIRCUIT AND METHOD FOR PROVIDING CONFIGURABLE REFERENCE VOLTAGE WITH FULL-SCALE RANGE

BACKGROUND

The present disclosure relates, in general, to semiconductor circuits and methods for operating the same. Specifically, the present disclosure relates to semiconductor circuits and methods for providing a configurable reference voltage with full-scale range.

Built-in self-testing is commonly employed for integrated circuit systems in advanced 2.5D or 3D package process, e.g., known-good-die (KGD) and known-good-system (KGS) test. To test signal integrity of a high speed interface, e.g., eye diagram measurement, a tunable voltage reference supporting full-scale voltage range is applied. A simple voltage reference generation methodology is to use a resistor-string-based voltage divider. However, this can require considerable footprint since a large number of resistors is needed for high resolution. Moreover, since device matching and size of resistors cannot be optimized as the manufacturing process evolves, it is not commonly used in advanced CMOS process. An alternative method is to generate voltage reference by a current-steering digital-to-analog converter (DAC) and a resistor. However, such DACs operate well over only a limited output voltage range. In other words, a reference voltage with full-scale range (e.g., 0V to VDD) cannot be provided.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
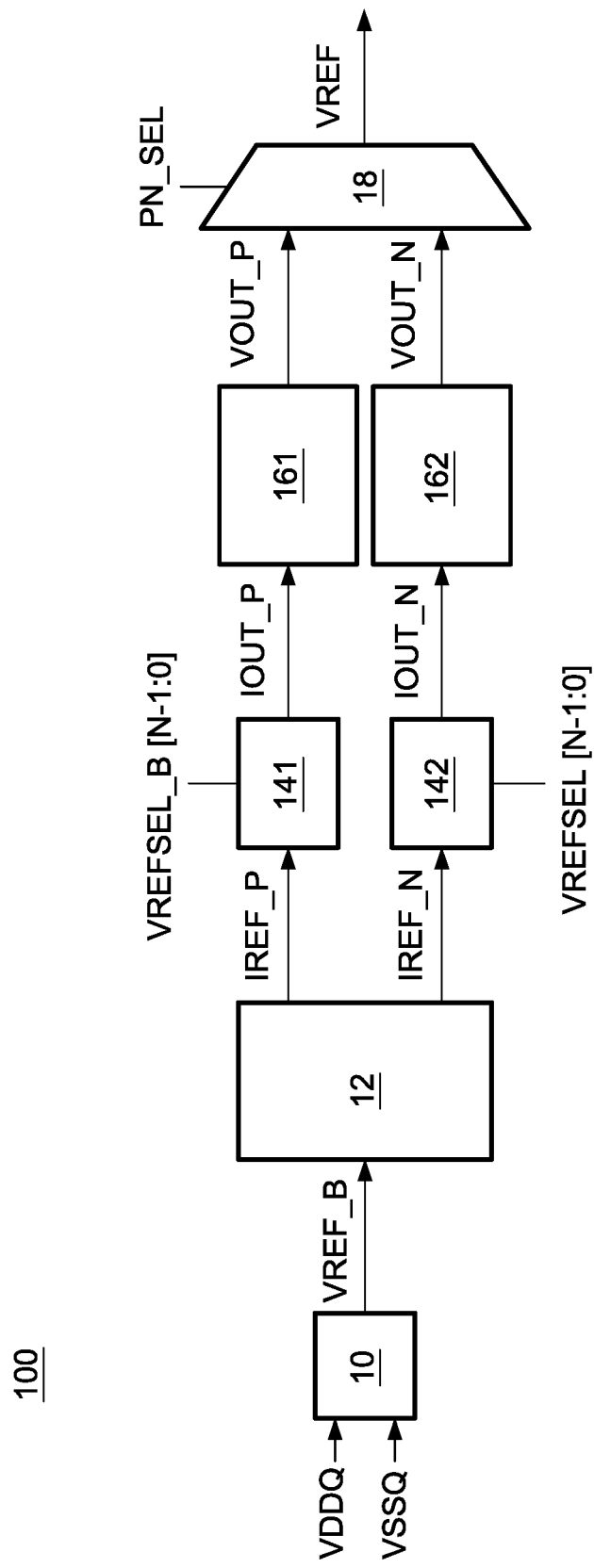
FIG. 1 is a schematic view of a semiconductor circuit, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A new circuit design is provided in the present disclosure, providing an accurate full-scale range voltage reference (VREF), which is immune to process, voltage, and temperature (PVT) variations. The proposed circuit design can be used, for example, in eye diagram testing for high speed interface. The proposed circuit design can also be used in low voltage operation design, e.g., 0.75V supply voltage, in advanced technologies.

FIG. 1 illustrates a schematic view of a semiconductor circuit, in accordance with some embodiments of the present disclosure.

FIG. 1 shows a semiconductor circuit 100. The semiconductor circuit 100 can be an electrical device. The semiconductor circuit 100 can be a semiconductor system. The semiconductor circuit 100 can be a part of an analog system. The semiconductor circuit 100 can be a part of a system of integrated circuits (IC). The semiconductor circuit 100 can be a reference voltage provider.

The semiconductor circuit 100 includes a voltage divider 10, a voltage-to-current converter 12, current-steering DACs 141 and 142, current-to-voltage converters 161 and 162, and a multiplexer 18. The voltage divider 10 is electrically connected to the voltage-to-current converter 12. The voltage-to-current converter 12 is electrically connected to the current-steering DACs 141 and 142. The current-steering DACs 141 and 142 are electrically connected to the voltage converters 161 and 162, respectively. The voltage converters 161 and 162 are electrically connected to the multiplexer 18.

The voltage divider 10 is configured to receive voltage levels VDDQ and VSSQ and provide a reference voltage VREF_B based on the voltage levels VDDQ and VSSQ. The voltage levels VDDQ and VSSQ can define a voltage swing of an analog signal VIN (not shown). The voltage level VDDQ can correspond to the maximum level of the analog signal VIN, and the voltage level VSSQ can correspond to the minimum level of the analog signal VIN. In some embodiments, the voltage level VDDQ can be a positive value. In some embodiments, the voltage level VSSQ can be a negative value. In some embodiments, the voltage level VSSQ can be zero.

The reference voltage VREF_B can be obtained by voltage levels VDDQ and VSSQ according to the following equation below.

$$\text{VREF}\_B = F_A \times (\text{VDDQ} + \text{VSSQ}) \quad \text{(Equation 1)}$$

In Equation 1, $F_A$ is a factor that can be utilized to adjust the reference voltage VREF_B in accordance with operational need. In some embodiments, the factor $F_A$ can be a positive value less than 1. In some embodiments, the factor $F_A$ can be a positive value less than 0.5. In some embodiments, the factor $F_A$ can be a positive value less than 0.2. A small value for factor $F_A$ facilitate the semiconductor 100 to provide a target voltage VREF suitable for low voltage operation design, e.g., 0.75V supply voltage, in advanced technologies. The voltage divider 10 is configured to adjust a voltage swing of the analog signal VIN by the factor $F_A$.

The voltage-to-current converter 12 is configured to receive the reference voltage VREF_B, and provide reference currents IREF_P and IREF_N. In some embodiments, the reference current IREF_P can be identical to the reference current IREF_N. In some embodiments, the reference current IREF_P and the reference current IREF_N can both be referred to as a reference current IREF. In some embodiments, the reference current IREF_P can be different than the reference current IREF_N.

The current-steering DAC 141 is configured to receive the reference current IREF_P from the voltage-to-current converter 12, and provide an output current IOUT_P. The current-steering DAC 142 is configured to receive the reference current IREF_N from the voltage-to-current converter 12, and provide an output current IOUT_N. The current-steering DAC 141 is configured to receive a binary code VREFSEL_B, and generate the output current IOUT_P based on the binary code VREFSEL_B and the reference current IREF_P. The current-steering DAC 142 is configured to receive a binary code VREFSEL, and generate the output current IOUT_N based on the binary code VREFSEL and the reference current IREF_N. In some embodiments, the binary codes VREFSEL and VREFSEL_B each include N bits, such that the current-steering DACs 141 and 142 can each provide a number $2^N$ of selectable values. That is, the current-steering DACs 141 and 142 are capable of providing a number $2^N$ of selectable different current values.

The binary code VREFSEL_B is associated with the binary code VREFSEL. In some embodiments, the binary code VREFSEL_B can be an inverted version of the binary code VREFSEL. In some embodiments, if the binary code VREFSEL is a seven-bit code with binary values "0010010," then the binary code VREFSEL_B will be a seven-bit code with binary values "1101101." In other embodiments, the binary code VREFSEL_B can be associated with the binary code VREFSEL in a different manner.

The voltage converter 161 is configured to receive the output current IOUT_P and provide a candidate voltage VOUT_P. The candidate voltage VOUT_P is generated based on the output current IOUT_P. The voltage converter 162 is configured to receive the output current IOUT_N and provide a candidate voltage VOUT_N. The candidate voltage VOUT_N is generated based on the output current IOUT_N.

The multiplexer 18 is configured to receive both the candidate voltages VOUT_P and VOUT_N, and then provide a target voltage VREF, in response to the control signal PN_SEL. The target voltage VREF can also be referred to as a configurable reference voltage in the present disclosure.

The control signal PN_SEL can be set according to a comparison between the binary code VREFSEL and a selection threshold SELth (not shown). In some embodiments, the control signal PN_SEL with the value "0" indicates that the binary code VREFSEL corresponds to a decimal less than the selection threshold SELth. In some embodiments, the control signal PN_SEL with the value "1" indicates that the binary code VREFSEL corresponds to a decimal exceeding the selection threshold SELth.

The multiplexer 18 is configured, in response to the control signal PN_SEL, to output the candidate voltage VOUT_P when the binary code VREFSEL corresponds to a decimal less than the selection threshold SELth. In addition, the multiplexer 18 is configured, in response to the control signal PN_SEL, to output the candidate voltage VOUT_N when the binary code VREFSEL corresponds to a decimal equal to or exceeding the selection threshold SELth.

In some embodiments, the binary code VREFSEL can have 7 bits, and the selection threshold SELth can be defined as 64. Therefore, when the binary code VREFSEL corresponds to a decimal in the range of 0 to 64, the multiplexer 18 outputs the candidate voltage VOUT_P. Similarly, when the binary code VREFSEL corresponds to a decimal in the range of 65 to 128, the multiplexer 18 outputs the candidate voltage VOUT_N.

In some embodiments, the binary code VREFSEL can have N bits, and the selection threshold SELth can be defined as $2^{N-1}$. In other embodiments, when the binary code VREFSEL has N bits, the selection threshold SELth can be set as an appropriate value other than $2^{N-1}$.

Figure 1A:
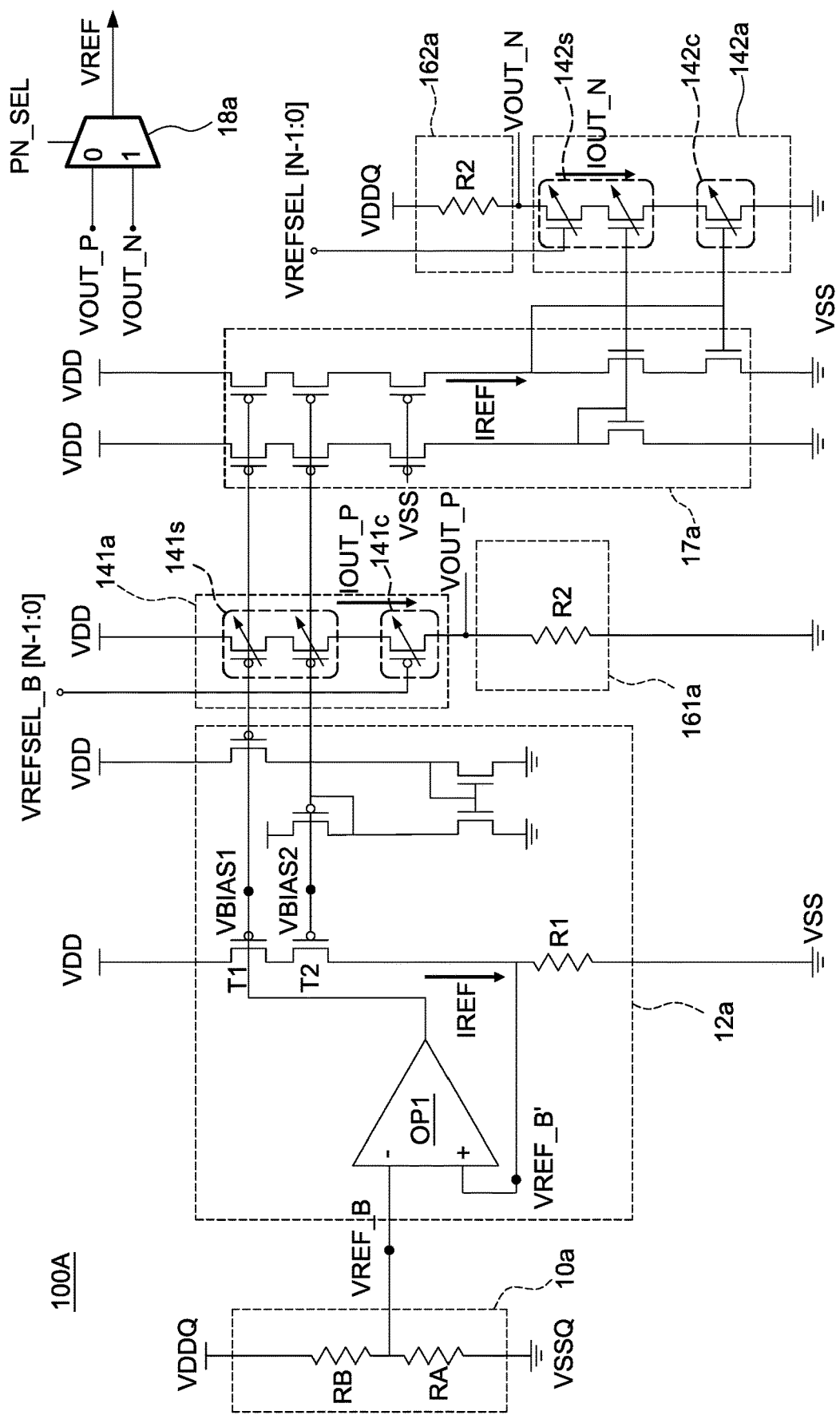
FIG. 1A is a schematic view of a semiconductor circuit, in accordance with some embodiments of the present disclosure.

FIG. 1A illustrates a schematic view of a semiconductor circuit, in accordance with some embodiments of the present disclosure.

FIG. 1A shows a semiconductor circuit 100A. The semiconductor circuit 100A can be a reference voltage provider. The semiconductor circuit 100A includes a voltage divider 10a, a voltage-to-current converter 12a, current-steering DACs 141a and 142a, current-to-voltage converters 161a and 162a, a current replica circuit 17a, and a multiplexer 18a. The semiconductor circuit 100A can be an exemplary implementation of the semiconductor circuit 100 shown in FIG. 1. In some embodiments, the semiconductor circuit 100 can include one or more components that are not shown in FIG. 1A.

Referring to FIG. 1A, the voltage divider 10a includes resistors RA and RB. The reference voltage VREF_B can be obtained in accordance with Equation 1. In this embodiment, the factor $F_A$ can be obtained by the following equation.

$$F_A = \frac{RA}{RA + RB} \quad \text{(Equation 2)}$$

VDD and VSS shown in FIG. 1A are supply voltages of the semiconductor circuit 100A. In some embodiments, the voltage VDD can be positive. In some embodiments, the voltage VSS can be negative. In some embodiments, the voltage VSS can be zero.

The voltage-to-current converter 12a includes an operational amplifier OP1 and a resistor R1. The inverting input of the operational amplifier OP1 receives the reference voltage VREF_B provided by the voltage divider 10a. Due to the property of the operational amplifier OP1, the voltage VREF_B' at the non-inverting input of the operational amplifier OP1 will be substantially identical to the reference voltage VREF_B. A reference current IREF will flow from the non-inverting input of the operational amplifier OP to the ground (VSS). The reference current IREF equals VREF_B'/R1.

The output of the operational amplifier OP is electrically connected to the transistor T1, and the non-inverting input of the operational amplifier OP1 is electrically connected to the transistor T2. The operational amplifier OP1 and the transistors T1 and T2 collectively form a closed loop. The closed loop of the voltage-to-current converter 12a is configured to provide self-biasing voltages VBIAS1 and VBIAS2 at the gate terminal of the transistors T1 and T2, respectively. Self-biasing voltages VBIAS1 and VBIAS2, as provided by the closed loop, retain stability over a wider range of input signal amplitude compared to other fixed bias amplifier circuits.

The current-steering DAC 141a includes a configurable current source 141s and a control circuit 141c. The control circuit 141c is configured to receive the binary code VREFSEL_B and provide the output current IOUT_P accordingly. The output current IOUT_P can be obtained in accordance with the equation shown here.

$$\text{IOUT\_P} = \frac{IREF \times (2^N - 1 - D_{\text{VREFSEL\_B}})}{2^{N-1}} \quad \text{(Equation 3)}$$

In Equation 3, N indicates that the binary code VREFSEL_B includes N bits. $D_{VREFSEL\_B}$ represents the decimal of the VREFSEL_B binary code.

In some embodiments, the configurable current source 141s can include one or more PMOS transistors. In some embodiments, the control circuit 141c can include one or more PMOS transistors.

The output current IOUT_P is converted to the candidate voltage VOUT_P by the current-to-voltage converter 161a. In some embodiments, the current-to-voltage converter 161a includes a resistor R2. The resistance of the resistor R2 has a relationship to that of the resistor R1 of the voltage-to-current converter 12a. The resistance of the resistor R2 can be configured as a multiple of the resistance of the resistor R1. The resistance of the resistor R2 can be configured in accordance with the equation below:

$$R2 = F_B \times R1 \quad \text{(Equation 4)}$$

Factor $F_B$ in Equation 4 is associated with the factor $F_A$ in Equations 1 and 2. In some embodiments, the factors $F_A$ and $F_B$ can be configured such that the product of the factors $F_A$ and $F_B$ are approximately 0.5, at which point the candidate voltage VOUT_P can linearly range from approximately 0 to 0.5*VDDQ, and the candidate voltage VOUT_N can linearly range from approximately 0.5*VDDQ to VDDQ. Therefore, the semiconductor circuit 100A would be able to provide a target voltage VREF with a linearly full-scale voltage range (e.g., 0 to VDDQ).

The resistors R1 and R2 can be resistors of the same type, such that the semiconductor circuit 100A is immune to PVT variation. That is, characteristics of the resistors R1 and R2 should have similar reactions to PVT variation. In some embodiments, the resistors R1 and R2 can both be polysilicon resistors or n-well resistors. In some embodiments, the resistors R1 and R2 can both be carbon film resistors, metal film resistors, metal oxide resistors, metal strip resistors, or any other type of resistor.

The current replica circuit 17a is electrically connected between the voltage-to-current converter 12a and the current-steering DAC 142a. The current replica circuit 17a is configured to mirror the reference current IREF generated by the voltage-to-current converter 12a to the current-steering DAC 142a.

The current-steering DAC 142a includes a configurable current source 142s and a control circuit 142c. The control circuit 142c is configured to receive the binary code VREFSEL and then provide the output current IOUT_N accordingly. The output current IOUT_N can be obtained in accordance with the equation below:

$$\text{IOUT\_N} = \frac{IREF \times (D_{VREFSEL} + 1)}{2^{N-1}} \quad \text{(Equation 5)}$$

In Equation 5, N indicates that the binary code VREFSEL includes N bits. $D_{VREFSEL}$ represents the decimal of the VREFSEL binary code.

In some embodiments, the configurable current source 142s can include one or more of NMOS transistors. In some embodiments, the control circuit 142c can include one or more of NMOS transistors.

The output current IOUT_N is converted to the candidate voltage VOUT_N by the current-to-voltage converter 162a. In some embodiments, the current-to-voltage converter 162a includes a resistor R2. The resistance of the resistor R2 has a relationship to that of the resistor R1. The resistance of the resistor R2 can be configured as a multiple of the resistance of the resistor R1. The resistance of the resistor R2 can be configured in accordance with Equation 4.

The multiplexer 18a is configured, in response to the control signal PN_SEL, to output the candidate voltage VOUT_P when the binary code VREFSEL corresponds to a decimal less than the selection threshold SELth. In addition, the multiplexer 18a is configured, in response to the control signal PN_SEL, to output the candidate voltage VOUT_N when the binary code VREFSEL corresponds to a decimal equal to or exceeding the selection threshold SELth.

In some embodiments, the binary code VREFSEL can have 7 bits, and the selection threshold SELth can be defined as 64. Therefore, when the binary code VREFSEL corresponds to a decimal in the range of 0 to 63, the multiplexer 18a outputs the candidate voltage VOUT_P. Similarly, when the binary code VREFSEL corresponds to a decimal in the range of 64 to 127, the multiplexer 18a outputs the candidate voltage VOUT_N.

Referring to Equation 3 and FIG. 1A, since the output current IOUT_P is configurable by means of the binary code VREFSEL_B, the target voltage VREF includes a configurable range associated with the binary code VREFSEL_B. Similarly, referring to Equation 5 and FIG. 1A, since the output current IOUT_N is configurable by means of the binary code VREFSEL, the target voltage VREF includes a configurable range associated with the binary code VREFSEL.

In some embodiments, the binary codes VREFSEL and VREFSEL_B can each include N bits, and thus the target voltage VREF includes a configurable range of a resolution of $2^N$.

Figure 1B:
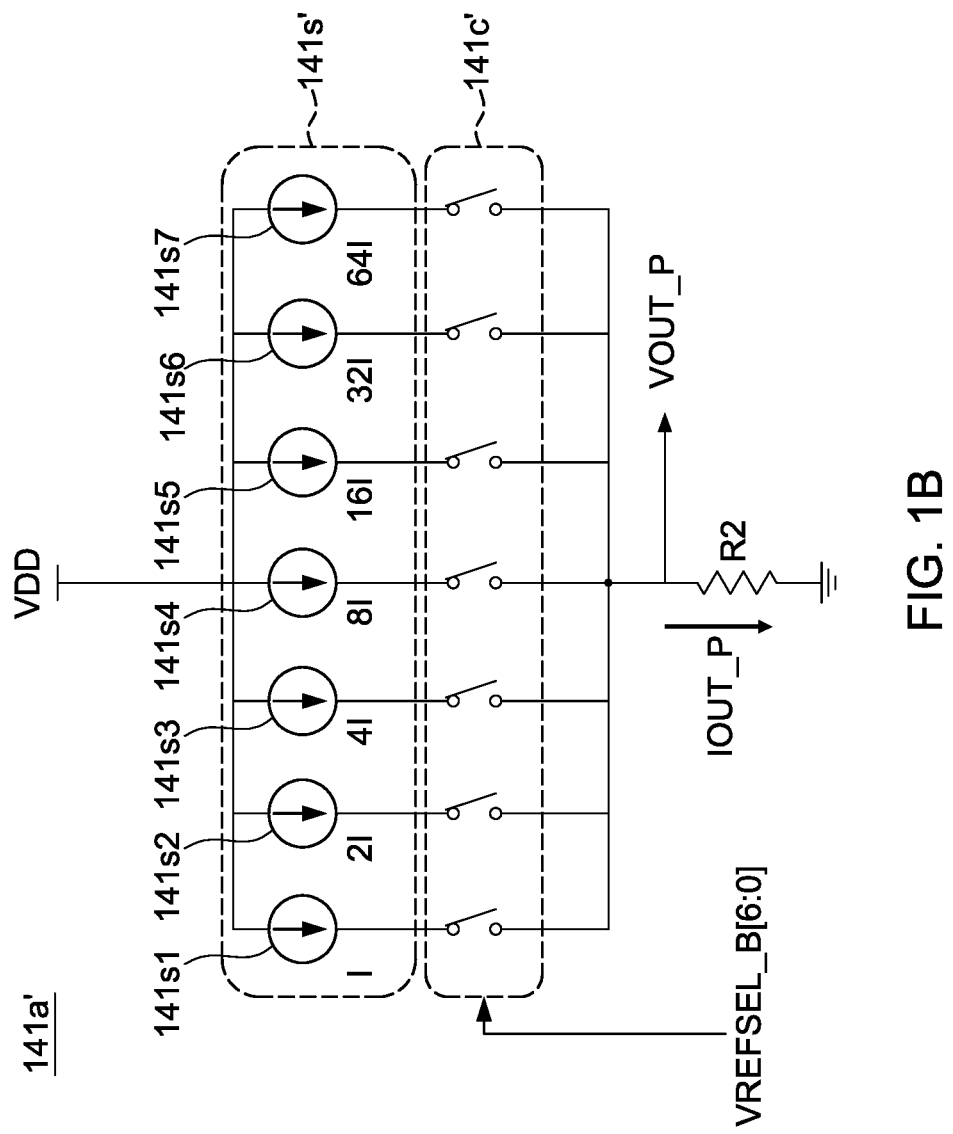
FIG. 1B is a schematic view of a current-steering DAC, in accordance with some embodiments of the present disclosure.

FIG. 1B illustrates a schematic view of a current-steering DAC, in accordance with some embodiments of the present disclosure.

FIG. 1B shows a current-steering DAC 141a'. The current-steering DAC 141a' is an exemplary implementation of the current-steering DAC 141a shown in FIG. 1A. The current-steering DAC 141a' includes a configurable current source 141s' and a control circuit 141c'. In this embodiment, the current-steering DAC 141a' is a seven-bit current source which can provide 128 different current values. In other embodiments, the current-steering DAC 141a' can be an N-bit current source which can provide $2^N$ different current values.

The configurable current source 141s' can include current sources 141s1, 141s2, 141s3, 141s4, 141s5, 141s6, and 141s7. Each of the current sources 141s1, 141s2, 141s3, 141s4, 141s5, 141s6, and 141s7 can be configured to provide currents of different values. The control circuit 141c' is configured to receive a seven-bit binary code VREFSEL_B to control the conduction of each of the current sources 141s1, 141s2, 141s3, 141s4, 141s5, 141s6, and 141s7. The current-steering DAC 141a' is configured to provide the output current IOUT_P in response to the seven-bit binary code VREFSEL_B.

In some embodiments, the current source 141s1 can include two PMOS transistors connected in series, as do the other current sources 141s2, 141s3, 141s4, 141s5, 141s6, and 141s7. Voltage headroom needs to be considered in the operation of these current sources for the transistors within these current sources to be operated in a linear region.

Although not illustrated in the exemplary implementation of the current-steering DAC 142b shown in FIG. 1A, it can be contemplated that the current-steering DAC 142b be constructed using NMOS current sources and a control circuit.

Figure 1C:
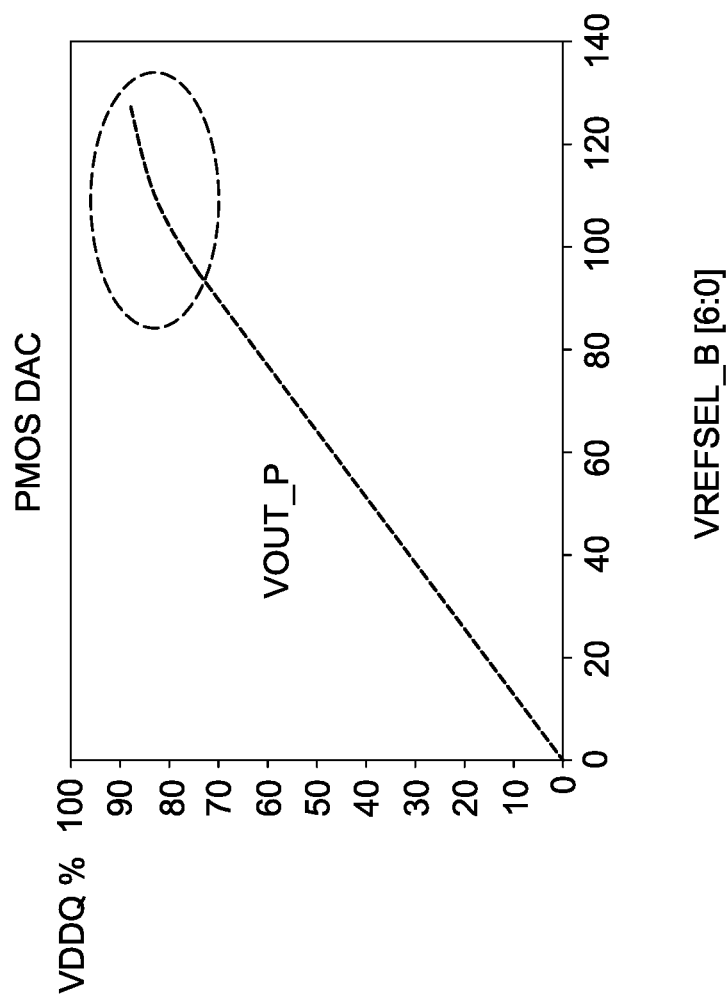
FIG. 1C is a diagram of a candidate voltage VOUT_P, in accordance with some embodiments of the present disclosure.

FIG. 1C is a diagram of a candidate voltage VOUT_P, in accordance with some embodiments of the present disclosure.

In FIG. 1C, the horizontal axis represents the decimal value of a seven-bit binary code VRESEL_B, and the vertical axis represents the ratio of the candidate voltage VOUT_P to the voltage level VDDQ. Due to the inherent properties of the PMOS transistors, distortion will be observed when the candidate voltage VOUT_P nears VDDQ.

Figure 1D:
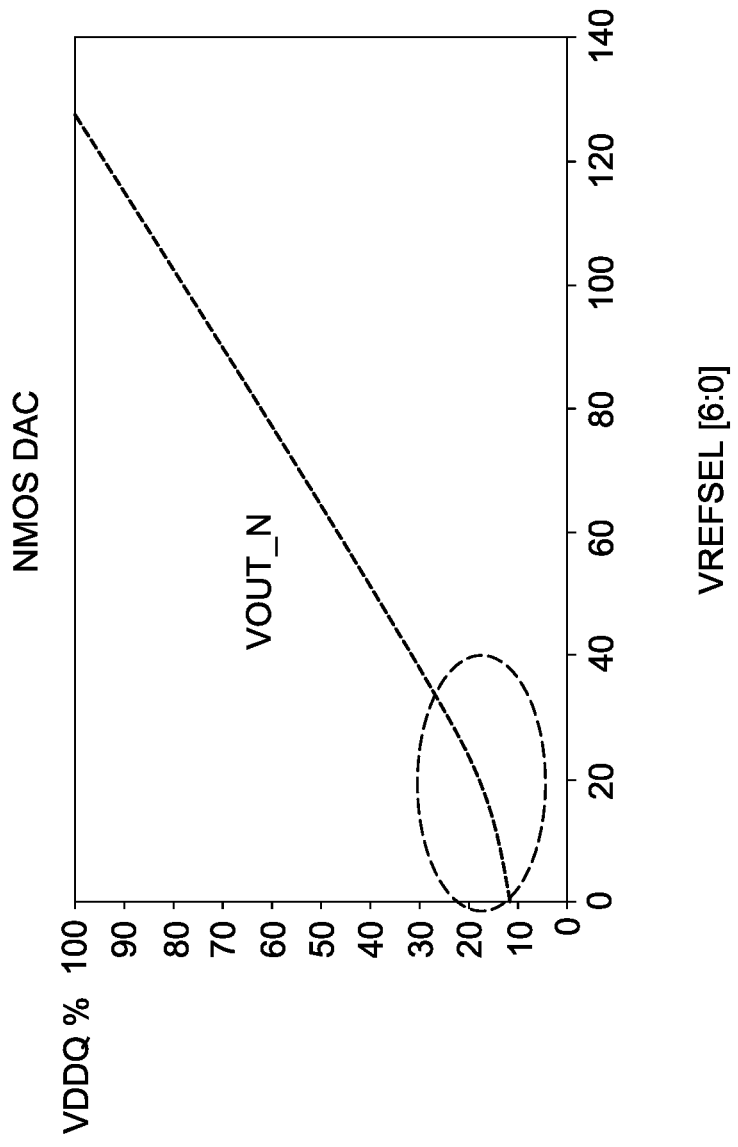
FIG. 1D is a diagram of a candidate voltage VOUT_N, in accordance with some embodiments of the present disclosure.

FIG. 1D is a diagram of a candidate voltage VOUT_N, in accordance with some embodiments of the present disclosure.

In FIG. 1D, the horizontal axis represents the decimal value of a seven-bit binary code VRESEL, and the vertical axis represents the ratio between the candidate voltage VOUT_N and the voltage level VDDQ. Due to the inherent properties of the NMOS transistors, distortion will be observed when the candidate voltage VOUT_N nears VSSQ (or 0V).

Figure 1E:
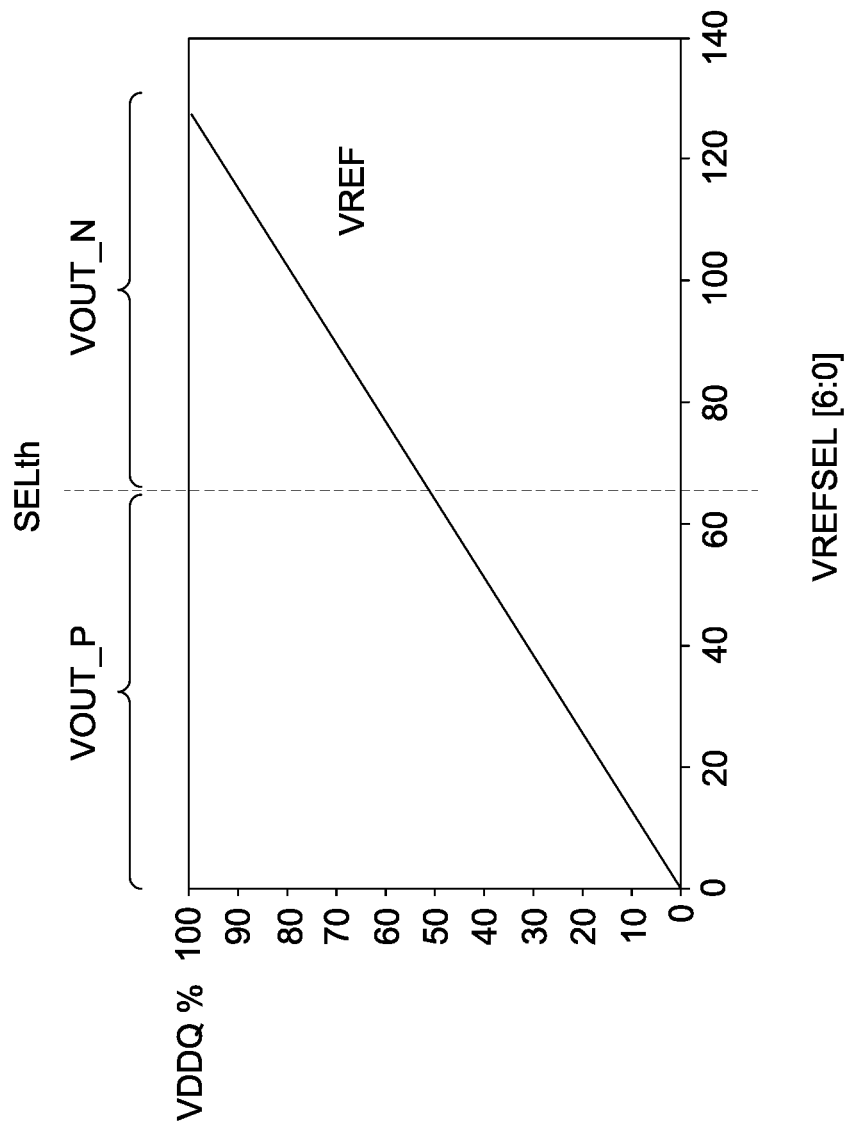
FIG. 1E is a diagram of a target voltage VREF, in accordance with some embodiments of the present disclosure.

FIG. 1E is a diagram of a target voltage VREF, in accordance with some embodiments of the present disclosure.

In FIG. 1E, the horizontal axis represents the decimal value of a seven-bit binary code VRESEL, and the vertical axis represents the ratio between the target voltage VREF and the voltage level VDDQ.

In this embodiment, the semiconductor circuit (e.g., 100 or 100A) of the present disclosure is configured to provide the candidate voltage VOUT_P when the binary code VREFSEL corresponds to a decimal less than the selection threshold SELth. In addition, the semiconductor circuit (e.g., 100 or 100A) is configured to provide the candidate voltage VOUT_N when the binary code VREFSEL corresponds to a decimal equal to or exceeding the selection threshold SELth. In this embodiment, the selection threshold SELth is set as 26. In some embodiments, the selection threshold SELth can be set as $2^{N-1}$ when the binary code VREFSEL includes N bits.

Referring to FIG. 1E, the semiconductor circuit (e.g., 100 or 100A) of the present disclosure is able to provide a configurable reference voltage VREF with full-scale range, and without distortion (i.e., high linearity).

Figure 2:
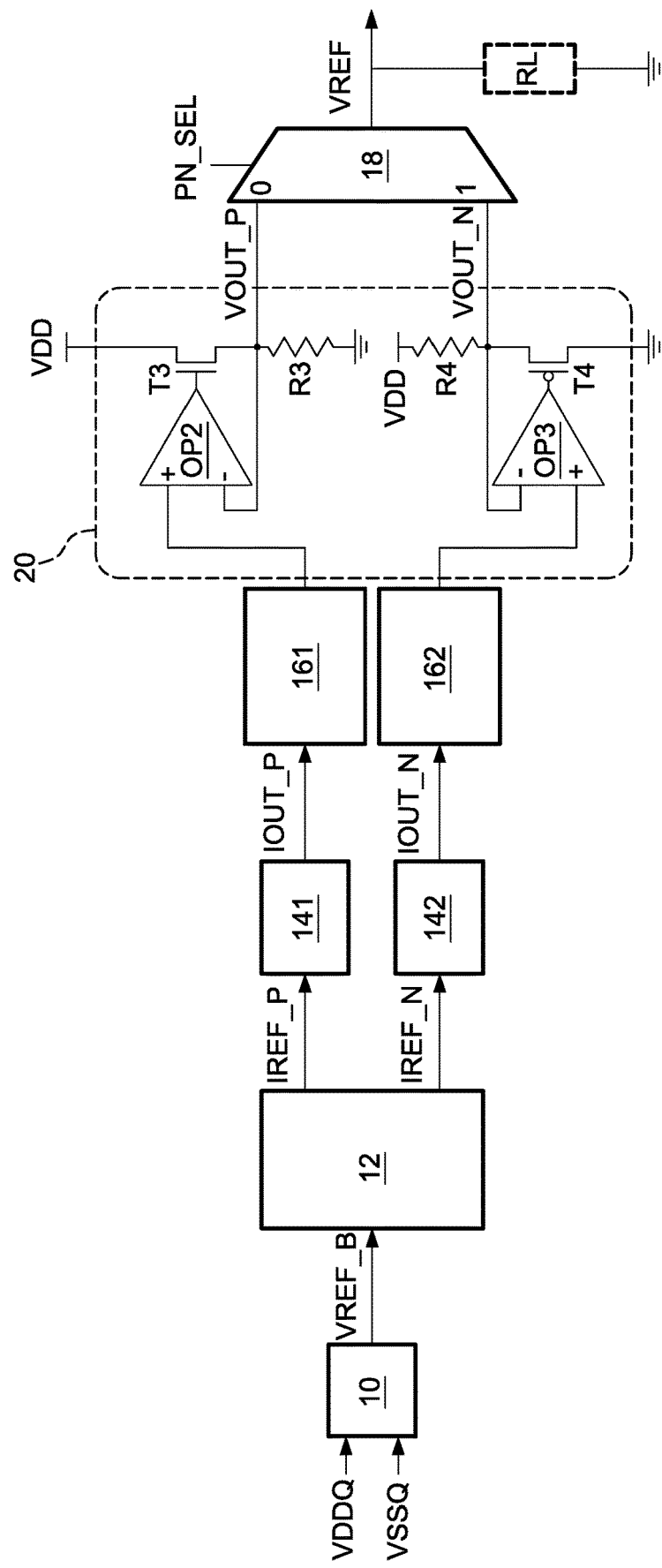
FIG. 2 is a schematic view of a semiconductor circuit, in accordance with some embodiments of the present disclosure.

FIG. 2 illustrates a schematic view of a semiconductor circuit, in accordance with some embodiments of the present disclosure.

FIG. 2 shows a semiconductor circuit 200. The semiconductor circuit 200 includes a voltage divider 10, a voltage-to-current converter 12, current-steering DACs 141 and 142, current-to-voltage converters 161 and 162, a buffering circuit 20, and a multiplexer 18. The voltage divider 10 is electrically connected to the voltage-to-current converter 12. The voltage-to-current converter 12 is electrically connected to the current-steering DACs 141 and 142. The current-steering DACs 141 and 142 are electrically connected to the voltage converters 161 and 162, respectively. The voltage converters 161 and 162 are electrically connected to the buffering circuit 20. The buffering circuit 20 is electrically connected to the multiplexer 18.

The difference between the semiconductor circuit 200 of FIG. 2 and the semiconductor circuit 100 of FIG. 1 lies in that the semiconductor circuit 200 further comprises a buffering circuit 20, such that the semiconductor circuit 200 is capable of driving an external resistive load RL. In some embodiments, the buffering circuit 20 can be connected between the voltage converters 161 and 162 and the multiplexer 18. In other embodiments, the buffering circuit 20 can be connected between the multiplexer 18 and the external resistive load RL.

Referring to FIG. 2, the buffering circuit 20 includes operational amplifiers OP2 and OP3, transistors T3 and T4, and resistors R3 and R4. The non-inverting input of the operational amplifier OP2 is electrically connected to the voltage converter 161, and the inverting input of the operational amplifier OP2 is electrically connected to the source terminal of the transistor T3. The output of the operational amplifier OP2 is electrically connected to the gate terminal of the transistor T3.

The non-inverting input of the operational amplifier OP3 is electrically connected to the voltage converter 162, and the inverting input of the operational amplifier OP3 is electrically connected to the drain terminal of the transistor T4. The output of the operational amplifier OP3 is electrically connected to the gate terminal of the transistor T4.

Figure 3:
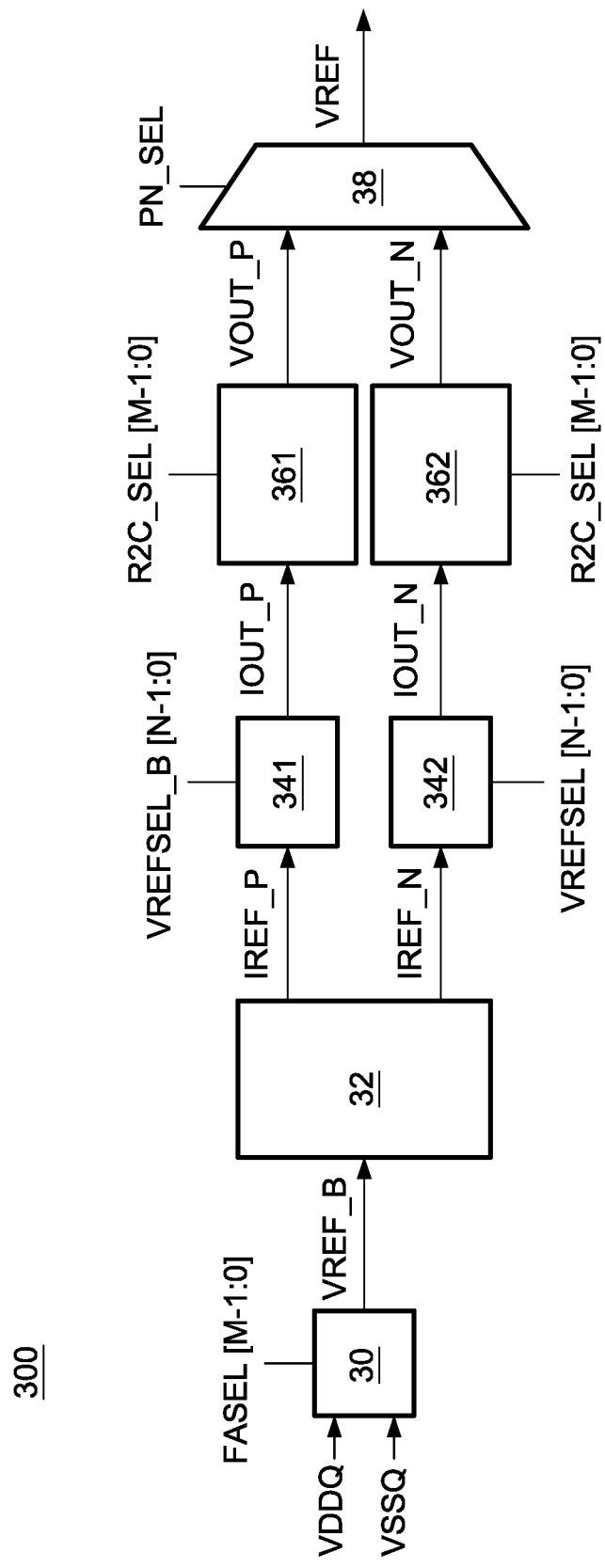
FIG. 3 is a schematic view of a semiconductor circuit, in accordance with some embodiments of the present disclosure.

FIG. 3 illustrates a schematic view of a semiconductor circuit, in accordance with some embodiments of the present disclosure.

FIG. 3 shows a semiconductor circuit 300. The semiconductor circuit 300 includes a voltage divider 30, a voltage-to-current converter 32, current-steering DACs 341 and 342, current-to-voltage converters 361 and 362, and a multiplexer 38.

The voltage divider 30 is electrically connected to the voltage-to-current converter 32. The voltage-to-current converter 32 is electrically connected to the current-steering DACs 341 and 342. The current-steering DACs 341 and 342 are electrically connected to the voltage converters 361 and 362, respectively. The voltage converters 361 and 362 are electrically connected to the multiplexer 38.

The voltage divider 30 is configured to receive voltage levels VDDQ and VSSQ and provide a reference voltage VREF_B based on the voltage levels VDDQ and VSSQ. The voltage levels VDDQ and VSSQ can define a voltage swing of an analog signal VIN (not shown). The voltage level VDDQ can correspond to the maximum level of the analog signal VIN, and the voltage level VSSQ can correspond to the minimum level of the analog signal VIN. In some embodiments, the voltage level VDDQ can be a positive value. In some embodiments, the voltage level VSSQ can be a negative value. In some embodiments, the voltage level VSSQ can be zero.

The reference voltage VREF_B to be generated by the voltage divider 30 can be obtained in accordance with the equation below:

$$VREF\_B = F_{AM} \times (VDDQ + VSSQ) \qquad \text{(Equation 6)}$$

In Equation 6, $F_{AM}$ is a configurable factor that can be utilized to adjust the reference voltage VREF_B in accordance with operational need. In some embodiments, the voltage divider 30 is configured to receive a binary code FASEL and then generate the reference voltage VREF_B accordingly. In some embodiments, the binary code FASEL can include M bits, and the reference voltage VREF_B can have a number $2^M$ of selectable values.

In some embodiments, the factor $F_{AM}$ can be configured as a positive value less than 1. In some embodiments, the factor $F_A$ can be configured as a positive value less than 0.5. In some embodiments, the factor $F_A$ can be configured as a positive value less than 0.2. The factor $F_{AM}$ being of a small value enables the semiconductor 300 to provide a target voltage VREF_B suitable for low voltage operation design, e.g., 0.75V supply voltage, in advanced technologies. The voltage divider 30 is configured to adjust a voltage swing of an analog signal by the factor $F_{AM}$.

With the voltage divider 30 capable of providing a configurable reference voltage VREF_B, the semiconductor circuit 300 can provide a configurable target voltage VREF. That is, the semiconductor circuit 300 will have more flexibility and can be applied to more tests that require different ranges of operating voltage.

The voltage-to-current converter 32 is configured to receive the reference voltage VREF_B, and provide reference currents IREF_P and IREF_N. In some embodiments, the reference current IREF_P can be identical to the reference current IREF_N. In some embodiments, the reference current IREF_P can be different than the reference current IREF_N.

Although not shown in FIG. 3, the voltage-to-current converter 32 can be configured to generate the reference currents IREF_P and IREF_N using a resistor R1. The voltage-to-current converter 32 can be constructed using electrical components similar to those included in the voltage-to-current converter 12a, as shown in FIG. 1A.

The current-steering DAC 341 is configured to receive the reference current IREF_P from the voltage-to-current converter 32, and provide an output current IOUT_P. The current-steering DAC 342 is configured to receive the reference current IREF_N from the voltage-to-current converter 32, and provide an output current IOUT_N. The current-steering DAC 341 is configured to receive a binary code VREFSEL_B, and generate the output current IOUT_P based on the binary code VREFSEL_B and the reference current IREF_P. The current-steering DAC 342 is configured to receive a binary code VREFSEL, and generate the output current IOUT_N based on the binary code VREFSEL and the reference current IREF_N. In some embodiments, the binary codes VREFSEL and VREFSEL_B each includes N bits, and thus the current-steering DACs 341 and 342 can each provide a number $2^N$ of selectable values. That is, the current-steering DACs 341 and 342 are capable of providing a number $2^N$ of selectable different current values.

The binary code VREFSEL_B is associated with the binary code VREFSEL. In some embodiments, the binary code VREFSEL_B can be an inverted version of the binary code VREFSEL. In some embodiments, if the binary code VREFSEL is a seven-bit code with binary values "0010010," then the binary code VREFSEL_B will be a seven-bit code with binary values "1101101." In other embodiments, the binary code VREFSEL_B can be associated with the binary code VREFSEL in a different manner.

The voltage converter 361 is configured to receive the output current IOUT_P and provide a candidate voltage VOUT_P. The candidate voltage VOUT_P is generated based on the output current IOUT_P. The voltage converter 362 is configured to receive the output current IOUT_N and provide a candidate voltage VOUT_N. The candidate voltage VOUT_N is generated based on the output current IOUT_N.

In some embodiments, the voltage converter 361 can include a configurable resistor R2c (not shown). The voltage converter 361 is configured to generate the candidate voltage VOUT_P based on the output current IOUT_P and the configurable resistor R2c. The resistance of the configurable resistor R2c can be configured in response to a binary code R2C_SEL received by the voltage converter 361. In some embodiments, the binary code R2C_SEL can include M bits, and the candidate voltage VOUT_P can have a number $2^M$ of selectable values.

In some embodiments, the voltage converter 362 can include a configurable resistor R2c (not shown). The voltage converter 362 is configured to generate the candidate voltage VOUT_N based on the output current IOUT_N and the configurable resistor R2c. The resistance of the configurable resistor R2c can be configured in response to a binary code R2C_SEL received by the voltage converter 362. In some embodiments, the binary code R2C_SEL can include M bits, and the candidate voltage VOUT_N can have a number $2^M$ of selectable values.

The multiplexer 38 is configured, in response to the control signal PN_SEL, to output the candidate voltage VOUT_P or the candidate voltage VOUT_N.

Figure 3A:
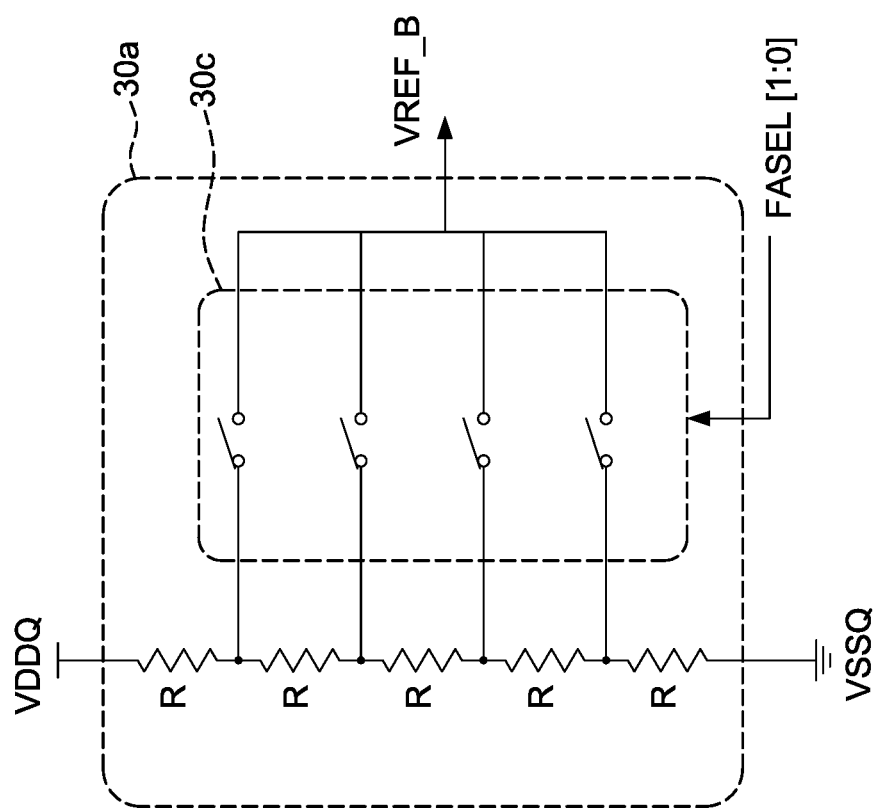
FIG. 3A is a schematic view of a voltage divider, in accordance with some embodiments of the present disclosure.

FIG. 3A illustrates a schematic view of a voltage divider, in accordance with some embodiments of the present disclosure.

FIG. 3A shows a voltage divider 30a. The voltage divider 30a can be an exemplary implementation of the voltage divider 30 shown in FIG. 3. The voltage divider 30a includes several resistors R connected in series, and a control circuit 30c. The voltage divider 30a is configured, in response to the binary code FASEL received, to select a specific value for the factor $F_{AM}$. The reference voltage VREF_B to be generated by the voltage divider 30a can be obtained in accordance with Equation 6.

In this embodiment, the voltage divider 30a is a two-bit voltage divider which can provide four different values for the factor $F_{AM}$. In other embodiments, the voltage divider 30a can be an M-bit current source which can provide $2^M$ different values for the factor $F_{AM}$. In the embodiment shown in FIG. 3A, assuming that VSSQ equals zero, the reference voltage VREF_B provided by the voltage divider 30a can be one of 0.2*VDDQ, 0.4*VDDQ, 0.6*VDDQ, or 0.8*VDDQ.

Figure 3C:
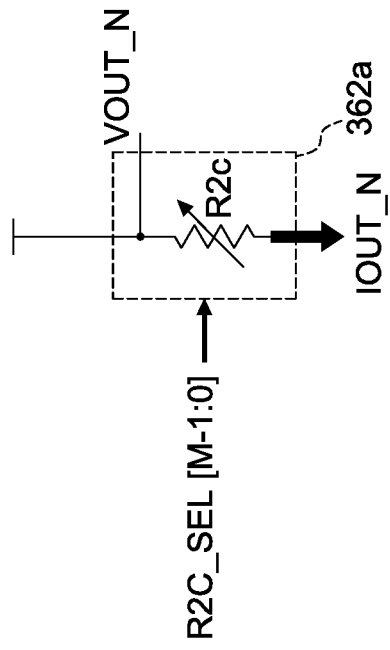
FIG. 3C is a schematic view of a voltage converter, in accordance with some embodiments of the present disclosure.
Figure 3B:
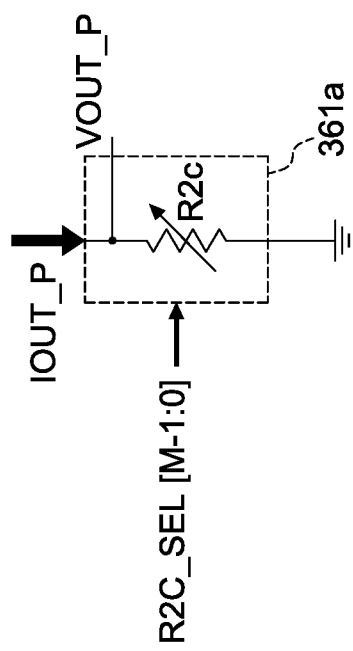
FIG. 3B is a schematic view of a voltage converter, in accordance with some embodiments of the present disclosure.

FIG. 3B illustrates a schematic view of a voltage converter, in accordance with some embodiments of the present disclosure. FIG. 3B shows a voltage converter 361a. The voltage converter 361a can be an exemplary implementation of the voltage converter 361 shown in FIG. 3. The voltage converter 361a includes a configurable resistor R2c. The resistance of the configurable resistor R2c can be configured in response to a binary code R2C_SEL. In some embodiments, the binary code R2C_SEL can include M bits, and the candidate voltage VOUT_N can have a number $2^M$ of selectable values.

The resistance of the configurable resistor R2c has a relationship to that of the resistor R1 of the voltage-to-current converter 32. The resistance of the configurable resistor R2c can be configured as a multiple of the resistance of the resistor R1. The resistance of the configurable resistor R2c can be configured in accordance with the equation below:

$$R2c = F_{BM} \times R1 \quad \text{(Equation 7)}$$

The factor $F_{BM}$ in Equation 7 is associated with the factor $F_{AM}$ in Equation 6. The factor $F_{BM}$ is associated with the binary code FASEL. In some embodiments, the factors $F_{AM}$ and $F_{BM}$ can be configured such that the product of the factors $F_{AM}$ and $F_{BM}$ are approximately 0.5. When the product of the factors $F_{AM}$ and $F_{BM}$ being approximately 0.5, the candidate voltage VOUT_P can linearly range from approximately 0 to 0.5*VDDQ, and the candidate voltage VOUT_N can linearly range from approximately 0.5*VDDQ to VDDQ. Therefore, the semiconductor circuit 300 can provide a target voltage VREF with a linearly full-scale voltage range (e.g., from 0 to VDDQ).

FIG. 3C illustrates a schematic view of a voltage converter, in accordance with some embodiments of the present disclosure. FIG. 3C shows a voltage converter 362a. The voltage converter 362a can be an exemplary implementation of the voltage converter 362 shown in FIG. 3. The voltage converter 362a includes a configurable resistor R2c. The resistance of the configurable resistor R2c can be configured in response to a binary code R2C_SEL. In some embodiments, the binary code R2C_SEL can include M bits, and the candidate voltage VOUT_N can have a number $2^M$ of selectable values.

Figure 4B:
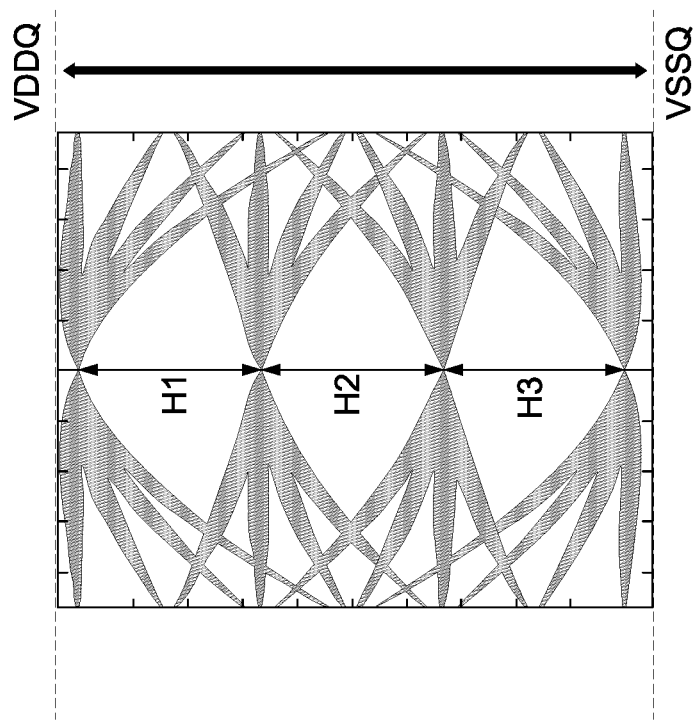
FIG. 4B shows a result of an eye diagram test, in accordance with some embodiments of the present disclosure.
Figure 4A:
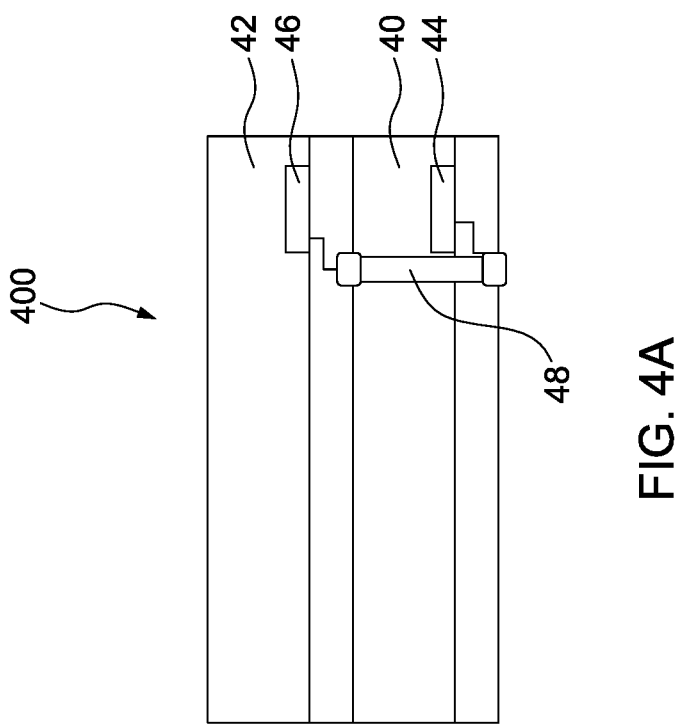
FIG. 4A is a schematic view of a semiconductor device, in accordance with some embodiments of the present disclosure.

FIG. 4A illustrates a schematic view of a semiconductor device, in accordance with some embodiments of the present disclosure.

FIG. 4A shows a semiconductor device 400. The semiconductor device 400 can be a 2.5D or 3D semiconductor package. The semiconductor device 400 includes a first die 40 and a second die 42 stacked above the first die 40. The first die 40 includes a processing unit 44, and the second die 42 includes a processing unit 46. The processing units 44 and 46 can be electrically connected through a data interface 48. The first die 40 can act as a transmitting terminal and the second die 42 can act as a receiving terminal. An eye diagram test can be performed on the data interface 48 by transmitting a sequence of test data from the first die 40 to the second die 42 through the data interface 48. An exemplary result of the eye diagram test performed on the data interface 48 is shown in FIG. 4B.

FIG. 4B is a result of an eye diagram test, in accordance with some embodiments of the present disclosure. FIG. 4B shows an exemplary test result of the eye diagram test performed on the data interface 48. In this embodiment, the first die 40 transmits a pulse amplitude modulation 4-level (PAM4) signal to the second die 42 through the data interface 48. The eye diagram of a PAM4 signal includes a first height H1 indicating the upper eye height, a second height H2 indicating the middle eye height, and a third height H3 indicating the low eye height.

In order to accurately measure the heights H1, H2, and H3, a voltage reference that can support full-scale voltage range is preferable. The semiconductor circuits 100, 100A, 200, and 300 as disclosed can be widely applicable in the advanced 2.5D or 3D semiconductor packages, for the purpose of built-in self-testing.

Figure 5:
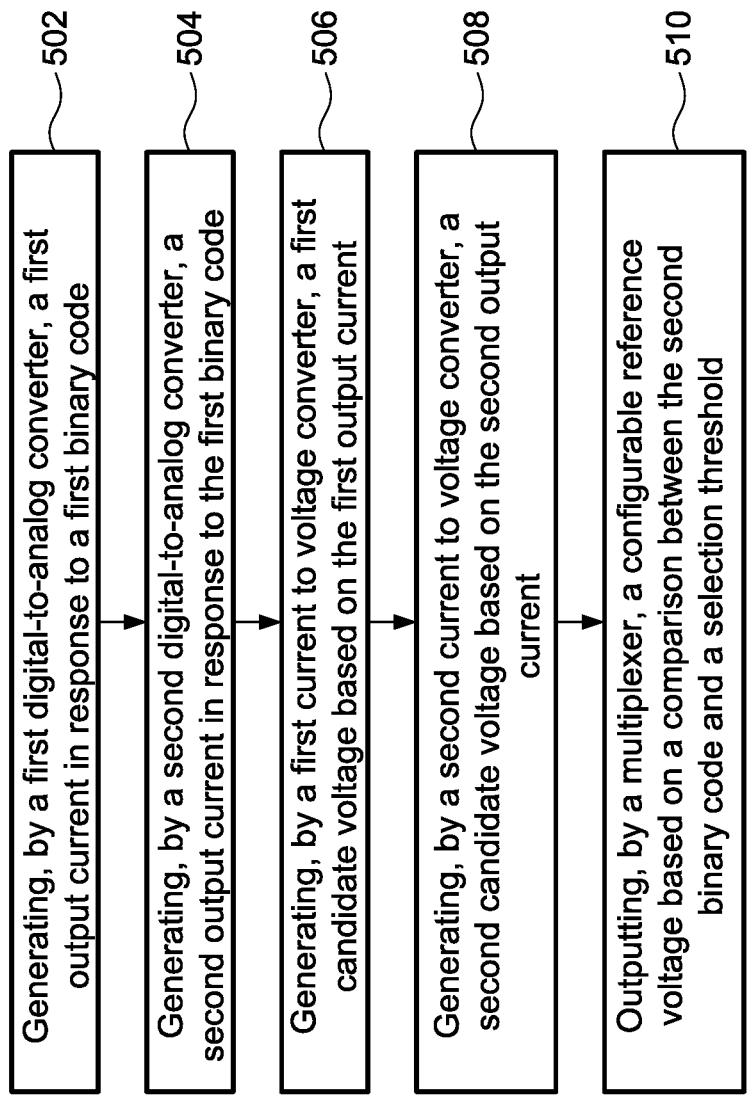
FIG. 5 is a flowchart of operations for a semiconductor circuit, in accordance with some embodiments of the present disclosure.

FIG. 5 is a flowchart of operations for operating a semiconductor circuit, in accordance with some embodiments of the present disclosure.

FIG. 5 includes operations 502, 504, 506, 508, and 510 for operating a semiconductor circuit. Although the operations 502, 504, 506, 508, and 510 are depicted in sequence in the figure, it can be contemplated that operations 502, 504, 506, 508, and 510 could be performed in an order other than that shown.

In operation 502, a first output current is generated by a first digital-to-analog converter in response to a first binary code. The operation 502 can be performed by, for example, digital-to-analog converters 141, 141a, or 341 as disclosed. For example, a first output current IOUT_P can be generated by a first digital-to-analog converter 141 in response to a first binary code VREFSEL_B.

In operation 504, a second output current is generated by a second digital-to-analog converter in response to a second binary code associated with the first binary code. The operation 504 can be performed by, for example, the digital-to-analog converters 142, 142a, or 342 as disclosed. For example, a second output current IOUT_N can be generated by a second digital-to-analog converter 142 in response to a second binary code VREFSEL.

In the operation 506, a first candidate voltage is generated by a first current-to-voltage converter based on the first output current. The operation 506 can be performed by, for example, the current-to-voltage converters 161, 161a, or 361 as disclosed. For example, a first candidate voltage VOUT_P can be generated by a first current-to-voltage converter 161 based on the first output current IOUT_P.

In the operation 508, a second candidate voltage is generated by a second current-to-voltage converter based on the second output current. The operation 508 can be performed by, for example, the current-to-voltage converters 162, 162a, or 362 as disclosed. For example, a second candidate voltage VOUT_N can be generated by a second current-to-voltage converter 162 based on the second output current IOUT_N.

In operation 510, a configurable reference voltage is output by a multiplexer based on a comparison between the second binary code and a selection threshold. The operation 510 can be performed by, for example, the multiplexers 18, 18a, or 38 as disclosed. For example, a configurable reference voltage VREF can be output by a multiplexer 18 based on a comparison between the second binary code VREFSEL and a selection threshold SELth.

Some embodiments of the present disclosure provide a semiconductor circuit. The semiconductor circuit comprises a first digital-to-analog converter configured to generate a first output current in response to a first binary code, and a second digital-to-analog converter configured to generate a second output current in response to a second binary code associated with the first binary code. The semiconductor circuit further comprises a first current-to-voltage converter configured to generate a first candidate voltage based on the first output current, and a second current-to-voltage converter configured to generate a second candidate voltage based on the second output current. The semiconductor circuit further comprises a multiplexer configured to output the target voltage based on the first candidate voltage or the second candidate voltage. Wherein the target voltage includes a configurable range associated with the second binary code.

Some embodiments of the present disclosure provide a semiconductor circuit. The semiconductor circuit comprises a first digital-to-analog converter configured to generate a first output current in response to a first binary code, and a second digital-to-analog converter configured to generate a second output current in response to a second binary code associated with the first binary code. The semiconductor circuit further comprises a multiplexer configured to output a configurable reference voltage based on a comparison between the second binary code and a selection threshold.

Some embodiments of the present disclosure provide a method for operating a semiconductor circuit. The method comprises generating, by a first digital-to-analog converter, a first output current in response to a first binary code, and generating, by a second digital-to-analog converter, a second output current in response to a second binary code associated with the first binary code. The method further comprises generating, by a first current-to-voltage converter, a first candidate voltage based on the first output current, and generating, by a second current-to-voltage converter, a second candidate voltage based on the second output current. The method further comprises outputting, by a multiplexer, a configurable reference voltage based on a comparison between the second binary code and a selection threshold.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor circuit for providing a target voltage, comprising:
   a first digital-to-analog converter configured to generate a first output current in response to a first binary code;
   a second digital-to-analog converter configured to generate a second output current in response to a second binary code associated with the first binary code;
   a first current-to-voltage converter configured to generate a first candidate voltage based on the first output current;
   a second current-to-voltage converter configured to generate a second candidate voltage based on the second output current; and
   a multiplexer configured to output the target voltage based on the first candidate voltage or the second candidate voltage, wherein
   the target voltage includes a configurable range associated with the second binary code.

2. The semiconductor circuit of claim 1, wherein the first binary code includes N bits, and the target voltage includes a configurable range of a resolution of $2^N$.

3. The semiconductor circuit of claim 1, wherein the multiplexer is configured to output the first candidate voltage when the second binary code corresponds to a decimal less than a selection threshold.

4. The semiconductor circuit of claim 3, wherein the multiplexer is configured to output the second candidate voltage when the second binary code corresponds to a decimal exceeding or equal to the selection threshold.

5. The semiconductor circuit of claim 4, wherein the selection threshold is defined as $2^{N-1}$.

6. The semiconductor circuit of claim 1, further comprising:
   a voltage divider configured to adjust a voltage swing of an analog signal by a first factor; and
   a voltage-to-current converter comprising a first reference resistor, wherein
   the voltage-to-current converter is electrically connected to the voltage divider and configured to provide a first reference current to first digital-to-analog converter and a second reference current to the second digital-to-analog converter.

7. The semiconductor circuit of claim 6, wherein the voltage-to-current converter comprises a first operational amplifier comprising a closed loop.

8. The semiconductor circuit of claim 6, wherein the first current-to-voltage converter and the second current-to-voltage converter each includes a second reference resistor of the same type of the first reference resistor, and wherein a ratio between the second reference resistor and the first reference resistor is associated with the first factor.

9. The semiconductor circuit of claim 1, further comprising:
a buffering circuit electrically connected the first current-to-voltage converter and the second current-to-voltage converter to the multiplexer, wherein
the buffering circuit comprising a second operational amplifier electrically connected between the first current-to-voltage converter and the multiplexer, and a third operational amplifier electrically connected between the second current-to-voltage converter and the multiplexer.

10. The semiconductor circuit of claim 1, further comprising a voltage divider configured to adjust a voltage swing of an analog signal by a first factor, wherein the voltage divider is configured to receive a third binary code includes M bits.

11. The semiconductor circuit of claim 10, wherein the first current-to-voltage converter and the second current-to-voltage converter each includes a configurable resistor, wherein the resistance of the configurable resistor is associated with the third binary code.

12. A semiconductor circuit for providing a configurable reference voltage, comprising:
a first digital-to-analog converter configured to generate a first output current in response to a first binary code;
a second digital-to-analog converter configured to generate a second output current in response to a second binary code associated with the first binary code; and
a multiplexer configured to output the configurable reference voltage based on a comparison between the second binary code and a selection threshold,
wherein the first binary code includes N bits, and the configurable reference voltage includes a number $2^N$ of selectable values.

13. The semiconductor circuit of claim 12, wherein the multiplexer is configured to output a voltage generated in accordance with the first output current when the second binary code corresponds to a decimal less than a selection threshold.

14. The semiconductor circuit of claim 12, wherein the multiplexer is configured to output a voltage generated in accordance with the second output current when the second binary code corresponds to a decimal equal to or greater than a selection threshold.

15. The semiconductor circuit of claim 12, wherein the selection threshold is defined as $2^{N-1}$.

16. The semiconductor circuit of claim 12, further comprising:
a voltage divider configured to adjust a voltage swing of an analog signal by a first factor;
a voltage-to-current converter comprising a first reference resistor; and
a second reference resistor electrically connected to the first digital-to-analog converter, wherein
a ratio between the second reference resistor and the first reference resistor is associated with the first factor.

17. The semiconductor circuit of claim 12, wherein the second binary code is an inverted version of the first binary code.

18. A method for operating a semiconductor circuit, comprising:
generating, by a first digital-to-analog converter, a first output current in response to a first binary code;
generating, by a second digital-to-analog converter, a second output current in response to a second binary code associated with the first binary code;
generating, by a first current-to-voltage converter, a first candidate voltage based on the first output current;
generating, by a second current-to-voltage converter, a second candidate voltage based on the second output current; and
outputting, by a multiplexer, a configurable reference voltage based on a comparison between the second binary code and a selection threshold.

19. The method of claim 18, wherein the configurable reference voltage corresponds to the first candidate voltage when the second binary code corresponds to a decimal less than the selection threshold.

20. The method of claim 18, wherein the configurable reference voltage corresponds to the second candidate voltage when the second binary code corresponds to a decimal equal to or exceeding the selection threshold.

* * * * *